United States Patent
Obara et al.

(10) Patent No.: US 10,498,311 B2
(45) Date of Patent: Dec. 3, 2019

(54) CRYSTAL RESONATOR

(71) Applicant: NIHON DEMPA KOGYO CO., LTD., Tokyo (JP)

(72) Inventors: Shigeru Obara, Saitama (JP); Tetsuya Sato, Saitama (JP); Masaaki Nakahara, Saitama (JP); Tomonori Shibazaki, Saitama (JP); Yuki Oi, Saitama (JP); Yuya Nishimura, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 469 days.

(21) Appl. No.: 15/461,477

(22) Filed: Mar. 17, 2017

(65) Prior Publication Data

US 2017/0279434 A1 Sep. 28, 2017

(30) Foreign Application Priority Data

Mar. 23, 2016 (JP) .................................. 2016-057830

(51) Int. Cl.
| | |
|---|---|
| *H01L 41/047* | (2006.01) |
| *H03H 9/17* | (2006.01) |
| *H03H 9/02* | (2006.01) |
| *H03H 9/13* | (2006.01) |
| *H03H 3/04* | (2006.01) |

(52) U.S. Cl.
CPC .......... *H03H 9/17* (2013.01); *H03H 9/02543* (2013.01); *H03H 9/132* (2013.01); *H03H 2003/0407* (2013.01)

(58) Field of Classification Search
CPC ...... H03H 9/17; H03H 9/02543; H03H 9/132; H03H 2003/0407
USPC ................................ 310/360, 361, 364, 365
See application file for complete search history.

(56) References Cited

U.S. PATENT DOCUMENTS

2010/0327705 A1* 12/2010 Koyama ............. H01L 41/0475
310/365
2017/0302249 A1* 10/2017 Obara et al. ............. H03H 9/17
310/365

FOREIGN PATENT DOCUMENTS

JP        H05243890        9/1993

* cited by examiner

*Primary Examiner* — Thomas M Dougherty
(74) *Attorney, Agent, or Firm* — JCIPRNET

(57) ABSTRACT

A crystal resonator includes a flat plate-shaped crystal element and excitation electrodes. The crystal element has principal surfaces parallel to an X'-axis and a Z'-axis. The X'-axis is an axis of rotating an X-axis in a range of 15 to 25 degrees around a Z-axis. The Z'-axis is an axis of rotating the Z-axis in a range of 33 to 35 degrees around the X'-axis. The excitation electrodes are formed on the respective principal. The excitation electrodes include a first region with a circular outer shape and a second region. The second region is formed at a peripheral area of the first region. The second region has a thickness thinner than the first region and has an elliptical outer shape. The elliptical shape has a long axis extending in a direction in a range of −5 to +15 degrees with respect to a direction that the X'-axis extends.

17 Claims, 14 Drawing Sheets

CRYSTAL RESONATOR

CROSS-REFERENCE TO RELATED APPLICATIONS

This application is based on and claims priority under 35 U.S.C. § 119 to Japanese Patent Application No. 2016-057830 filed on Mar. 23, 2016, the entire content of which is incorporated herein by reference.

TECHNICAL FIELD

This disclosure relates to a crystal resonator where a doubly rotated cut crystal elementis used.

DESCRIPTION OF THE RELATED ART

There has been known a doubly rotated crystal resonator that uses a doubly rotated cut crystal element. The doubly rotated cut crystal element is formed by cutting a crystal parallel to an X'-axis, an axis of rotating an X-axis as a crystallographic axis of the crystal by $\phi$ degrees around a Z-axis as a crystallographic axis and a Z'-axis, an axis of rotating the Z-axis around the X'-axis by θ degrees. Japanese Unexamined Patent Application Publication No. 5-243890 describes an SC-cut crystal resonator with, for example, $\phi$ of approximately 22 degrees and θ of approximately 34 degrees. Such doubly rotated crystal resonator features good thermal shock property compared with that of an AT-cut crystal resonator and exhibits a zero temperature coefficient at a comparatively high temperature around 80° C. Accordingly, the doubly rotated crystal resonator is housed in an oven heated to a constant temperature at, for example, around 80° C. and is used as a highly-stable crystal controlled oscillator.

However, the doubly rotated crystal resonator as disclosed in JP-A-5-243890 has the following problems. Unwanted responses in a contour mode and a flexure mode combine with the main vibration. This is likely to cause a sudden frequency change and a change in crystal impedance (CI) due to a temperature change. Since the doubly rotated crystal resonator and the AT-cut crystal resonator have modes of vibration different from one another, it is difficult to reduce the unwanted response with the use of the technique of the AT-cut crystal resonator for the doubly rotated crystal resonator as it is.

A need thus exists for a crystal resonator which is not susceptible to the drawback mentioned above.

SUMMARY

According to an aspect of this disclosure, there is provided a crystal resonator that includes a flat plate-shaped crystal element and excitation electrodes. The crystal element has principal surfaces parallel to an X'-axis and a Z'-axis. The X'-axis is an axis of rotating an X-axis as a crystallographic axis of a crystal in a range of 15 degrees to 25 degrees around a Z-axis as a crystallographic axis of the crystal. The Z'-axis is an axis of rotating the Z-axis in a range of 33 degrees to 35 degrees around the X'-axis. The excitation electrodes are formed on the respective principal surfaces of the crystal element. The excitation electrodes include a first region with a circular outer shape and a second region. The second region is formed at a peripheral area of the first region. The second region has a thickness thinner than the first region and has an elliptical outer shape. The elliptical shape has a long axis extending in a direction in a range of −5 degrees to +15 degrees with respect to a direction that the X'-axis extends.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

The embodiments of this disclosure will be described in detail with reference to the drawings. The embodiments in the following description do not limit the scope of the disclosure unless otherwise stated.

First Embodiment

<Configuration of Crystal Resonator 100>

Figure 1:
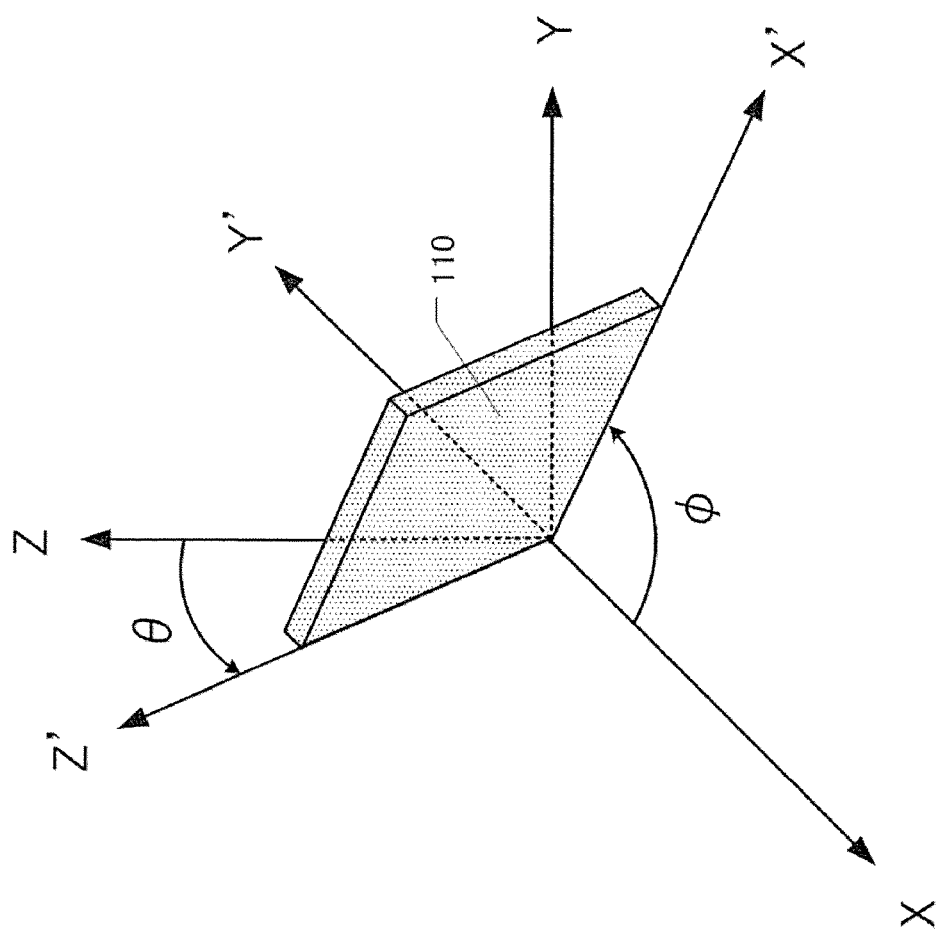
FIG. 1 is an explanatory drawing of a doubly rotated cut crystal element 110.

FIG. 1 is an explanatory drawing of a doubly rotated cut crystal element 110. FIG. 1 denotes crystallographic axes for a crystal as an X-axis, a Y-axis, and a Z-axis. The doubly rotated cut crystal element 110 is formed by cutting the crystal parallel to an X'-axis, an axis of rotating the X-axis as the crystallographic axis of the crystal around the Z-axis by $\phi$ degrees as the crystallographic axis of the crystal and a Z'-axis, an axis of rotating the Z-axis around the X'-axis by θ degrees. Therefore, the doubly rotated cut crystal element 110 is formed such that the X'-Z' surface becomes a principal surface. FIG. 1 shows a Y'-axis perpendicular to the X'-axis and the Z'-axis.

As the doubly rotated cut crystal element illustrated in FIG. 1, for example, there has been known an SC-cut crystal element with φ of approximately 22 degrees and θ of approximately 34 degrees, an IT-cut crystal element with of approximately 19 degrees and θ of approximately 34 degrees, and an FC-cut crystal element with φ of approximately 15 degrees and θ of 34.33 degrees. These crystal elements have φ between 15 degrees and 25 degrees and θ between 33 degrees and 35 degrees. The following gives the description assuming the use of the doubly rotated cut crystal element with φ between 15 degrees and 25 degrees and θ between 33 degrees and 35 degrees.

Figure 2A:
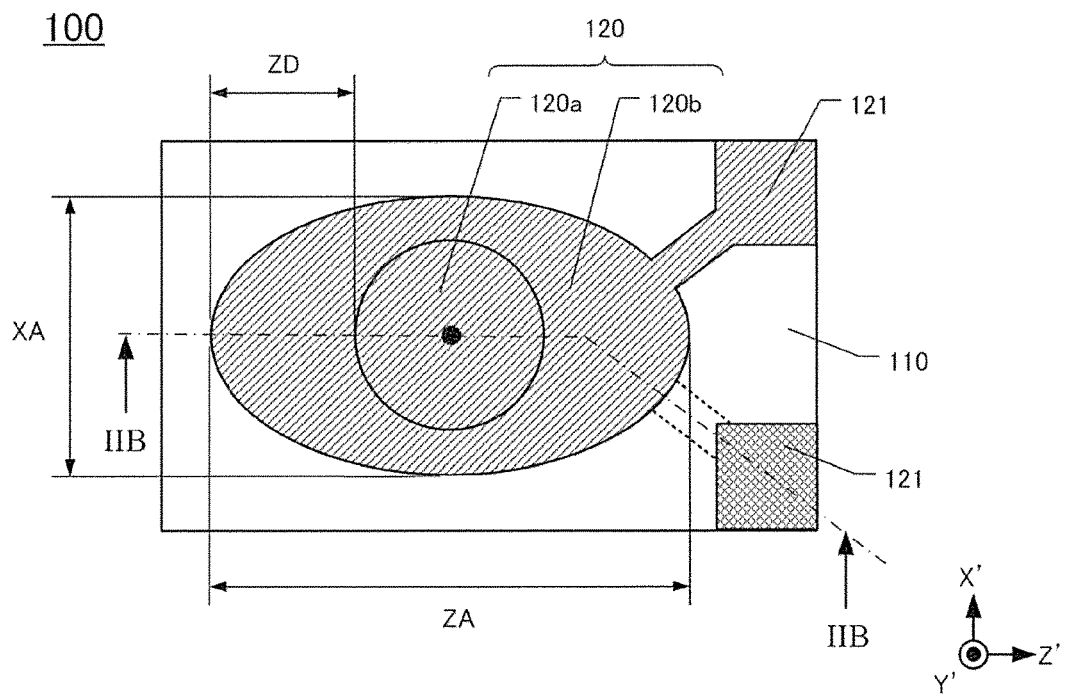
FIG. 2A is a plan view of a crystal resonator 100.

FIG. 2A is a plan view of the crystal resonator 100. The crystal resonator 100 includes a crystal element 110, excitation electrodes 120, and extraction electrodes 121. The crystal element 110 is formed into a rectangular flat plate shape whose long sides extend in the Z'-axis direction and short sides extend in the X'-axis direction. Arranging an outer shape of the square-plate-shaped crystal resonator is easy and the production cost can be reduced low, and thereby the crystal resonator is preferable.

The excitation electrodes 120 are formed on respective front and back principal surfaces (the respective surfaces on the +Y'-axis side and the −Y'-axis side) of the crystal element 110. The respective excitation electrodes 120 have the identical shape and are formed to overlap with one another in the Y'-axis direction. The excitation electrode 120 includes a first region 120a with a circular outer shape and a second region 120b. The second region 120b is formed at a peripheral area of the first region 120a. The second region 120b has a thickness thinner than the first region 120a and has an elliptical outer shape. The excitation electrodes 120 are formed so as to match a center of the first region 120a with a center of the second region 120b. The extraction electrodes 121 are each extracted from the excitation electrodes 120 to a side on the +Z'-axis side of the crystal element 110.

Conventionally, while the crystal element has been formed into the square plate shape in accordance with downsizing of the crystal resonator, to provide the excitation electrode with a large area in order to achieve a good electric constant, the excitation electrode has been formed into the square shape. However, the square excitation electrode is likely to cause a coupling of an unwanted response in a flexure mode with a reflected wave from an end surface of the crystal element. This has caused a variation of and an increase in CI value. In contrast to this, a circular excitation electrode can reduce the reflected wave from the end surface of the crystal element and can prevent the coupling, thereby ensuring preventing the variation of and the increase in CI value. Furthermore, since an elliptical excitation electrode can widen the area of the excitation electrode to achieve the good electric constant and also can prevent the variation of and the increase in CI value similar to the circular excitation electrode, the elliptical excitation electrode is preferable.

The second region 120b in the excitation electrode 120 is formed such that the long axis extends in the Z'-axis direction and the short axis extends in the X'-axis direction. FIG. 2A denotes a length of the long axis of the second region 120b as ZA, a length of the short axis of the second region 120b as XA, and a difference between a long radius of the second region 120b and a radius of the first region 120a as ZD. In the case where the length ZA of the long axis is in a range of 1.1 times to 2.0 times of the length XA of the short axis, the variation of and the increase in CI value tend to be reduced and therefore such length is preferable.

Figure 2B:
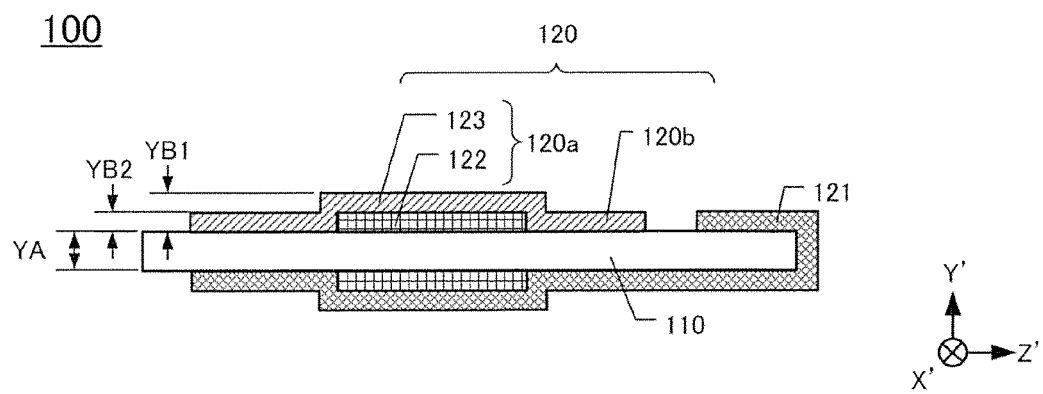
FIG. 2B is a cross-sectional view taken along a line IIB-IIB in FIG. 2A.

FIG. 2B is a cross-sectional view taken along a line IIB-IIB in FIG. 2A. FIG. 2B denotes a thickness of the crystal element 110 as YA, a thickness of the first region 120a in the excitation electrode 120 as YB1, and a thickness of the second region 120b in the excitation electrode 120 as YB2. The excitation electrodes 120 are double electrodes formed by stacking two electrode layers, a first layer 122 and a second layer 123, together. The first layer 122 and the second layer 123 form the first region 120a in the excitation electrode 120. The second layer 123 forms the second region 120b. Therefore, the thickness of the first layer 122 is a value found by subtracting the thickness YB2 from the thickness YB1. The thickness of the second layer 123 is the thickness YB2.

The thickness YB1, which is the thickness of the first region 120a in the excitation electrode 120, is preferably formed to be the thickness between 700' Å and 3000' Å and is especially preferably formed between 1200' Å and 1600'Å because of the following reasons. The extremely thinned excitation electrode fails to function as the electrode and therefore cannot confine a main vibration. The extremely thickened excitation electrode increases a weight of the electrode, resulting in the increase in CI value and the variation of CI value. There is a preferable relationship between the thickness YA and the thickness YB1. The thickness YB1 with the value between 0.02% and 0.13% of the thickness YA generates a small variation of CI value and therefore is preferable. Since an oscillation frequency of the crystal resonator is inversely proportional to the thickness of the crystal element, the thickness YA is determined according to the oscillation frequency of the crystal resonator 100. Therefore, the thickness YB1 is determined to have the value between 0.02% and 0.13% of the thickness YA and between 700' Å and 3000' Å according to the thickness YA. Furthermore, since the increase in CI value and the variation of CI value can be reduced, it is preferable to form the first region 120a and the second region 120b so as to have a difference in thickness (YB1−YB2) in a range of ¼ times to one time with respect to the thickness YB2 of the second region 120b. FIG. 2A and FIG. 2B show the example where the sides along the Z'-direction as the long sides and the sides along the X'-direction as the short sides, and the extraction electrodes 121 are disposed on the one side along the X'-direction. However, an example where the short sides go along the Z'-direction, the long sides go along the X'-direction, and the extraction electrodes 121 are disposed on one side along the Z'-direction, that is, a structure where the structure in FIG. 2A and FIG. 2B is rotated by 90 degrees on the X'-Z' surface may be employed.

<Double Electrodes>

With the crystal resonator 100, the double electrodes are formed to reduce the CI value. The following describes effects brought by the double electrode.

Figure 3A:
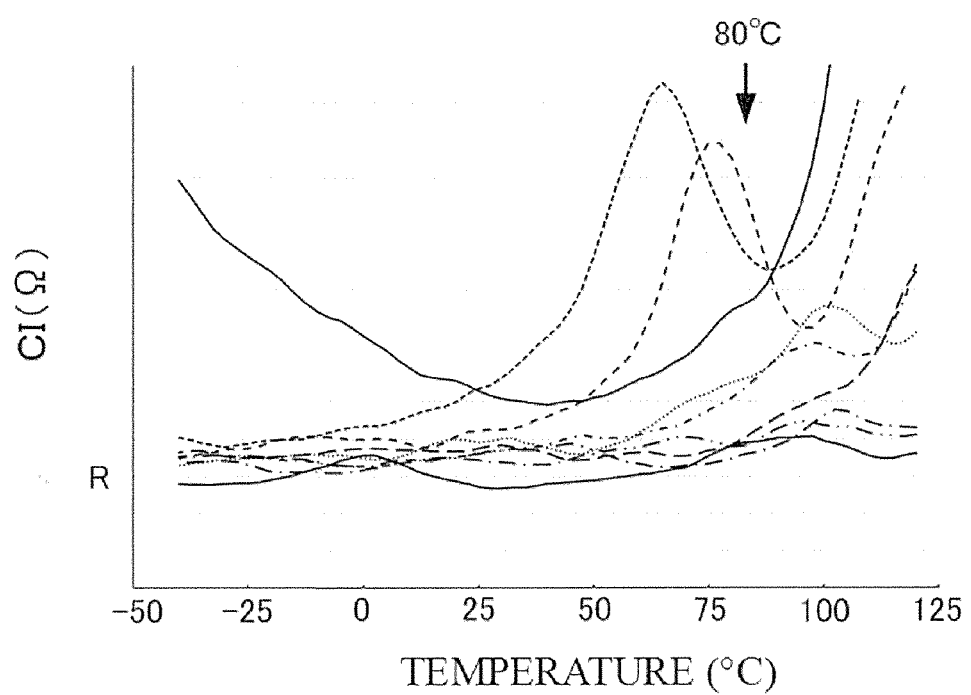
FIG. 3A is a graph showing a change in CI value according to a temperature in the case where excitation electrodes are single layers.

FIG. 3A is a graph showing a change in CI value according to a temperature in the case where an excitation electrode is a single layer. The horizontal axis indicates the temperature of the crystal resonator, and the vertical axis indicates the CI value. Note that, the drawings in FIG. 3A to FIG. 3C each denote a common reference CI value as a guideline in each experiment as R. FIG. 3A describes the CI with a scale in units of 100Ω with respect to R. FIG. 3A shows the change in CI value of the nine crystal resonators according to the temperature. FIG. 3A shows results in the case where the crystal resonators that include the excitation electrodes with a thickness of 1400' Å and a diameter of 0.6

A mm on a crystal element with an A-mm square by an evaporation method was oscillated at 30 MHz.

It is found from FIG. 3A that a tendency of the change in CI value according to the temperature substantially differs depending on a crystal resonator; therefore, the CI value is unstable. For example, at 80° C., the temperature at which a doubly rotated crystal resonator is possibly used, the lowest CI value is approximately (R+50) Ω and the highest CI value is approximately (R+850) Ω. That is, FIG. 3A shows that the crystal resonators possibly cause the variation of approximately 800Ω at 80° C.

Figure 3B:
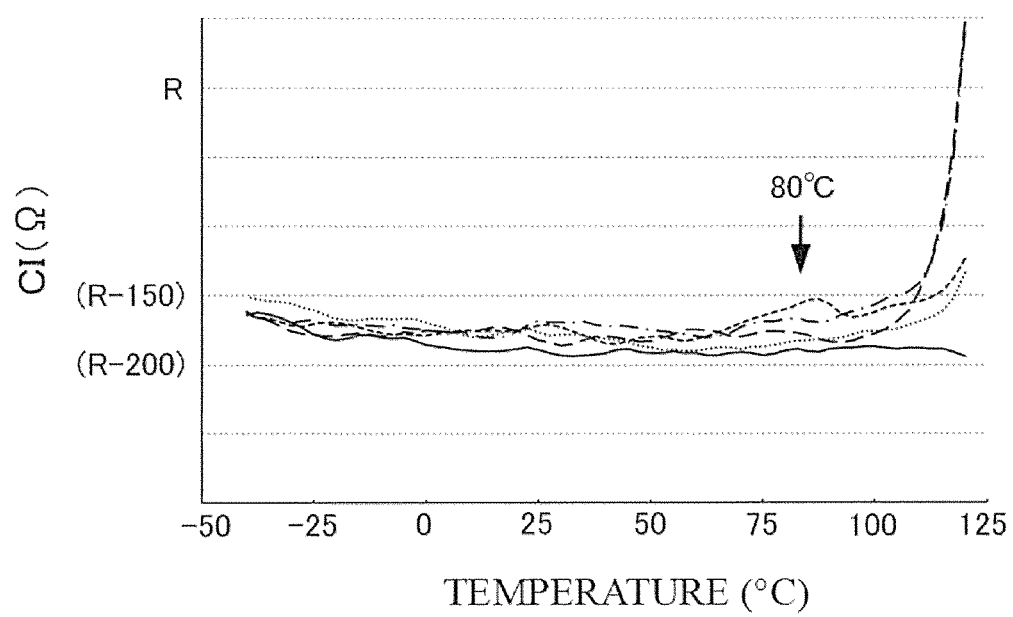
FIG. 3B is a graph showing the change in CI value according to the temperature in the case where crystal resonators with double electrodes whose long axes are 1.1 times of short axes are oscillated at 30 MHz.

FIG. 3B is a graph showing the change in CI value according to the temperature in the case where the crystal resonators with the double electrodes whose long axes are 1.1 times of the short axes are oscillated at 30 MHz. FIG. 3B shows the change in CI value of the five crystal resonators according to the temperature and provides a scale at intervals of 50Ω on the vertical axis. The crystal resonators in FIG. 3B include the elliptical excitation electrodes formed as the double electrodes that include the circular first region with the diameter of 0.75 B mm, the second region with the length of the long axis of 1.1 B mm and the length of the short axis of B mm. The long axis of the excitation electrodes is parallel to the Z'-axis.

The CI values in FIG. 3B fall within approximately (R−200) Ω to (R−150) Ω. For example, at 80° C., the temperature at which the doubly rotated crystal resonator is possibly used, the lowest CI value is (R−189.4) Ω and the highest CI value is (R−159.7) Ω. That is, FIG. 3B shows that the crystal resonators possibly cause the variation of CI value by 29.7Ω at 80° C.

Figure 3C:
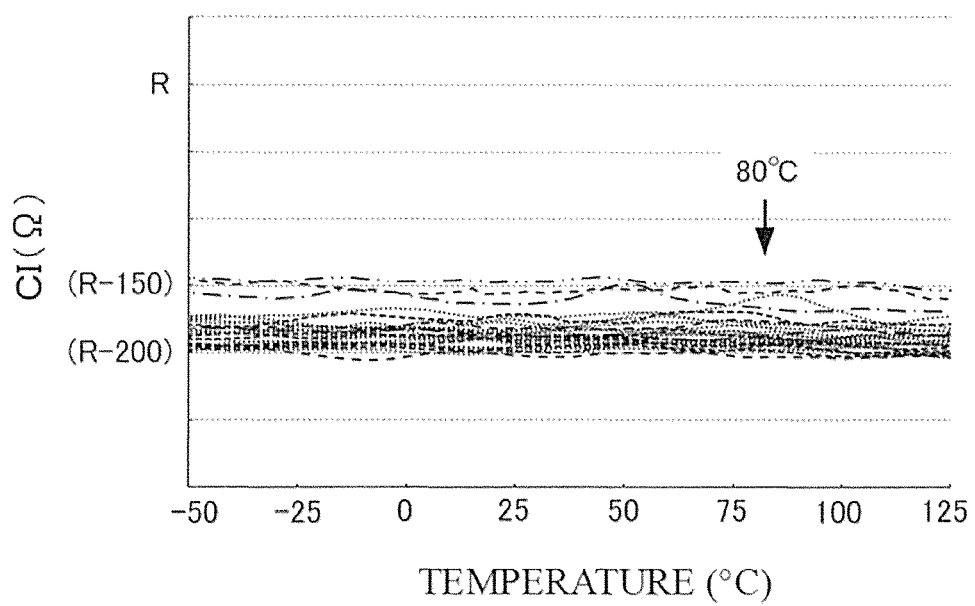
FIG. 3C is a graph showing the change in CI value according to the temperature in the case where crystal resonators with double electrodes whose long axes are 1.12 times of short axes are oscillated at 60 MHz.

FIG. 3C is a graph showing the change in CI value according to the temperature in the case where the crystal resonators with the double electrodes whose long axes are 1.12 times of the short axes are oscillated at 60 MHz. FIG. 3C shows the change in CI value of the 36 crystal resonators according to the temperature and provides a scale at intervals of 50Ω on the vertical axis. The crystal resonators in FIG. 3C include the elliptical excitation electrodes formed as the double electrodes that include the circular first region with the diameter of C mm, the second region with the length of the long axis of 1.344×C mm, and the length of the short axis of 1.2×C mm. The long axis of the excitation electrodes is parallel to the Z'-axis.

The CI values in FIG. 3C fall within approximately (R−200) Ω to (R−150) Ω. For example, at 80° C., the temperature at which the doubly rotated crystal resonator is possibly used, the lowest CI value is (R−202.92) Ω and the highest CI value is (R−147.84) Ω. That is, FIG. 3C shows that the crystal resonators possibly cause the variation of CI value by 54.98Ω at 80° C.

It is seen that the crystal resonator including the excitation electrodes formed as the double electrodes as shown in FIG. 3B and FIG. 3C has the lower CI value and the small variation of CI value compared with those of the excitation electrode of the single layer as shown in FIG. 3A.

<Direction that Long Axis of Second Region Extends>

Figure 4A:
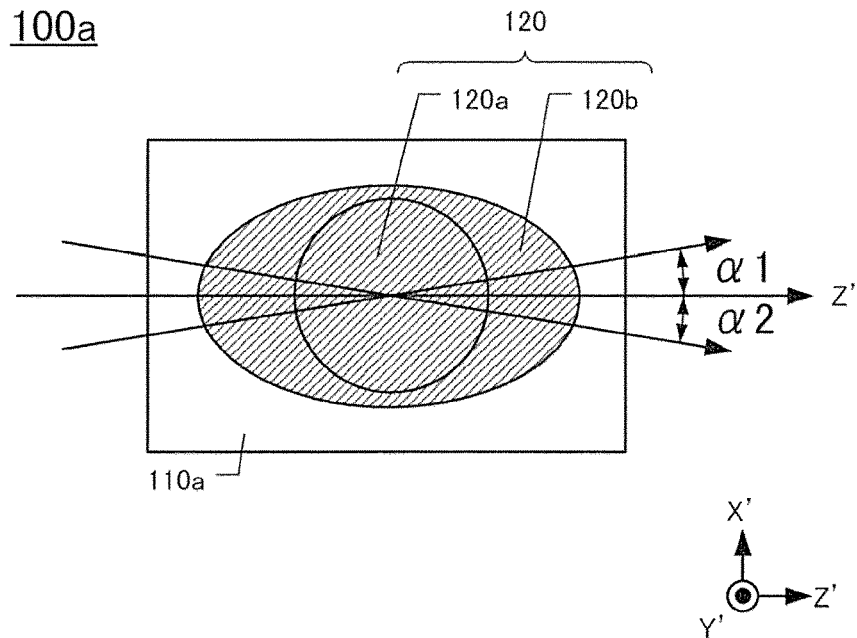
FIG. 4A is a schematic plan view of a crystal resonator 100a, and FIG. 4B is a schematic plan view of a crystal resonator 100b.

FIG. 4A is a schematic plan view of a crystal resonator 100a. The crystal resonator 100a includes a crystal element 110a and an excitation electrode 120. Although an extraction electrode and a similar member are also formed on the crystal resonator 100a, FIG. 4A illustrates only the crystal element 110a and the excitation electrode 120.

The outer shape of the excitation electrode is preferably the elliptical shape. However, with the excitation electrode having the long axis extending in the Z'-axis direction, the flexure vibration, which is the unwanted response, transmitted in the Z'-axis direction can be reduced. This can reduce the increase in CI value. Assuming that an angle formed by rotating the Z'-axis counterclockwise as α1 and an angle formed by rotating the Z'-axis clockwise as α2, when the direction that the long axis of the excitation electrode 120a extends is a direction with α1 and α2 in a range of 5 degrees, an effect that the flexure vibration can be reduced is likely to obtained. That is, assuming that the counterclockwise direction as a positive direction while the clockwise direction as a negative direction, the case where the long axis of the excitation electrode extends in the direction in the range of ±5 degrees with respect to the direction that the Z'-axis extends is preferable.

Figure 4B:
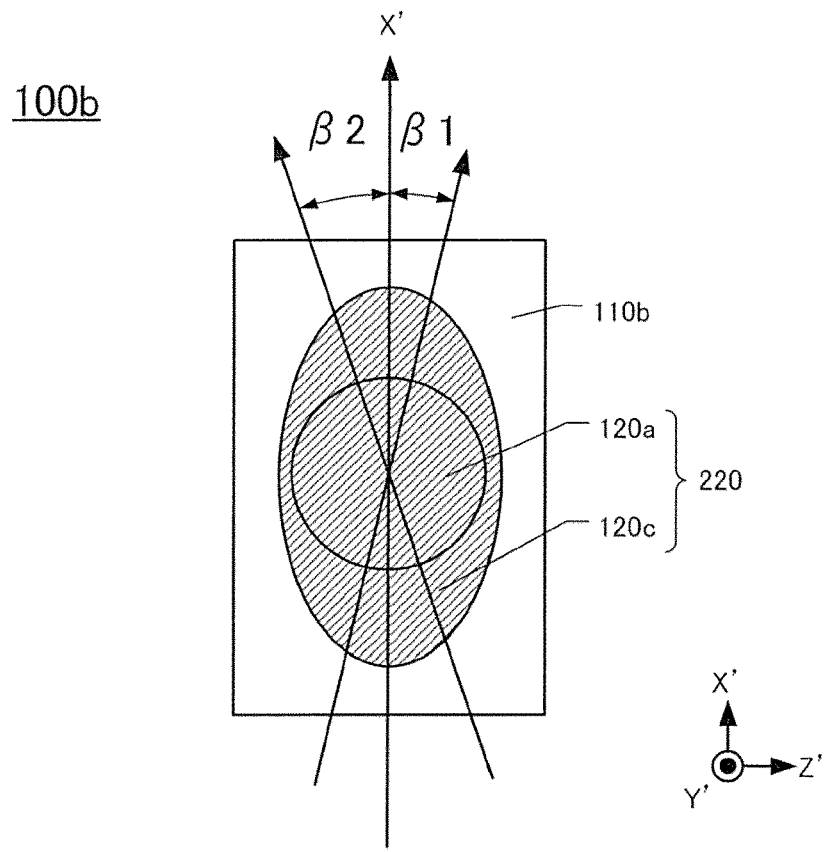

FIG. 4B is a schematic plan view of a crystal resonator 100b. The crystal resonator 100b includes a crystal element 110b and excitation electrodes 220. Although an extraction electrode and a similar member are also formed on the crystal resonator 100b, FIG. 4B illustrates only the crystal element 110b and the excitation electrodes 220. The excitation electrodes 220 are the double electrodes including the first region 120a and the second region 120c. The first region 120a is formed into the circular shape while the second region 120c is formed into the elliptical shape whose long axis extends in the X'-axis direction. The crystal element 110b is formed into the rectangular shape whose long sides extend in the X'-axis direction.

In the case where the long axis of the excitation electrode extends in the X'-axis direction like the excitation electrode 220, the flexure vibration and an end surface reflection, which are the unwanted responses, can be reduced, thereby ensuring reducing the increase in CI value. In the case where the long axis of the excitation electrode extends in a range of −5 degrees to +15 degrees with respect to the X'-axis of the crystal element (that is, in a range indicated by β1 and β2 in FIG. 4B), the increase in CI value can be reduced.

Second Embodiment

The crystal element and the excitation electrode can be formed into various shapes. The following describes modifications of the crystal element and the excitation electrode.

<Configurations of Crystal Resonator 200a and Crystal Resonator 200b>

Figure 5A:
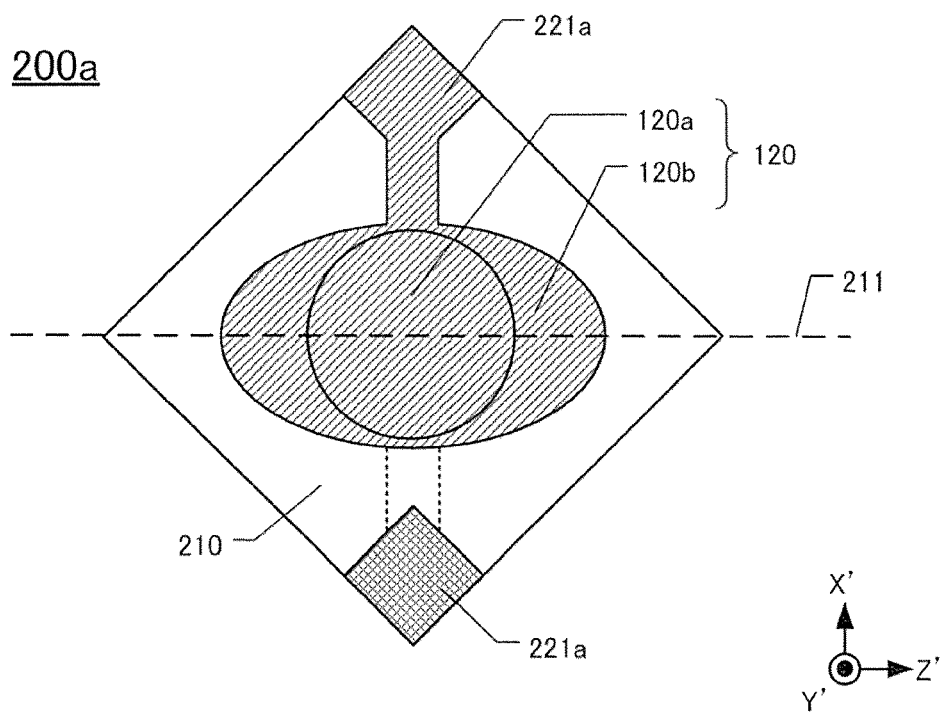
FIG. 5A is a plan view of a crystal resonator 200a, and FIG. 5B is a plan view of a crystal resonator 200b.

FIG. 5A is a plan view of the crystal resonator 200a. The crystal resonator 200a includes a crystal element 210 with square planar surface, the excitation electrodes 120 formed on both principal surfaces of the crystal element 210, and extraction electrodes 221a extracted from the respective excitation electrodes 120. While the crystal element 110 (see FIG. 2A) is formed into the rectangular shape, arranging the shape of the square crystal element 210, which has the short side length identical to the long side length, is also easy and the production cost can be reduced low, and thereby the crystal element 210 is preferable. The crystal element 210 has one diagonal line 211 parallel to the Z'-axis. The long axis of the second region 120b in the excitation electrode 120 is formed to go along the diagonal line 211. The larger area of the excitation electrode makes the electric constant stable and therefore is preferable. Meanwhile, forming the excitation electrode 120 along the diagonal line 211 allows forming the area of the excitation electrode 120 large in the crystal element 210 with predetermined size and therefore is preferable. With the crystal resonator 200a, the extraction electrodes 221a are each extracted to corners on a diagonal line of the crystal element 210 on the +X'-axis side and the −X'-axis side of the crystal element 210.

Figure 5B:
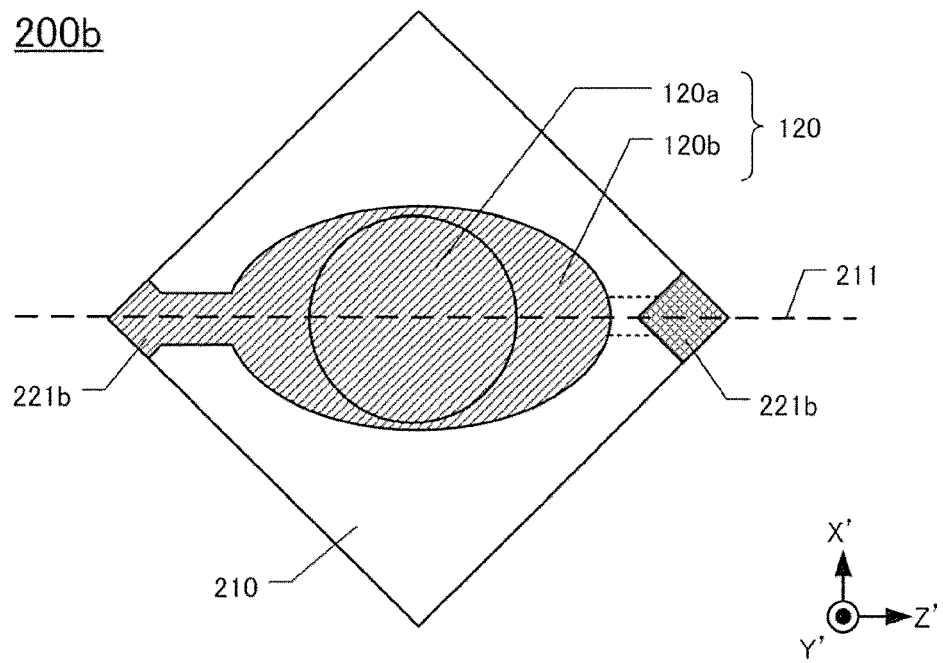

FIG. 5B is a plan view of the crystal resonator 200*b*. The crystal resonator 200*b* includes the crystal element 210 with square planar surface, the excitation electrodes 120 formed on both principal surfaces of the crystal element 210, and extraction electrodes 221*b* extracted from the respective excitation electrodes 120. The extraction electrodes 221*b* are extracted to corners of the crystal element 210 on the +Z'-axis side and the −Z'-axis side of the excitation electrodes 120. In both cases of FIG. 5A and FIG. 5B, the crystal element is held at the corner portions on the diagonal line of the crystal element, ensuring stably holding the crystal element. However, the holding positions are not limited to these. FIG. 5A and FIG. 5B show the examples where the diagonal lines of the crystal elements are parallel to the Z'-axis and the X'-axis and therefore the corner portions of the crystal element are positioned on the Z'-axis and the X'-axis. Note that, considering an influence given to the support or a similar influence, the diagonal line of the crystal element meets a preferable positional relationship where the diagonal line is neither parallel to the Z'-axis nor the X'-axis and is positioned in a range of ±10 degrees with respect to the Z'-axis and the X'-axis, that is, the corner portions of the crystal element are positioned on a line displaced from the Z'-axis and the X'-axis by predetermined degrees in some cases.

<Configurations of Crystal Resonator 300*a* and Crystal Resonator 300*b*>

Figure 6A:
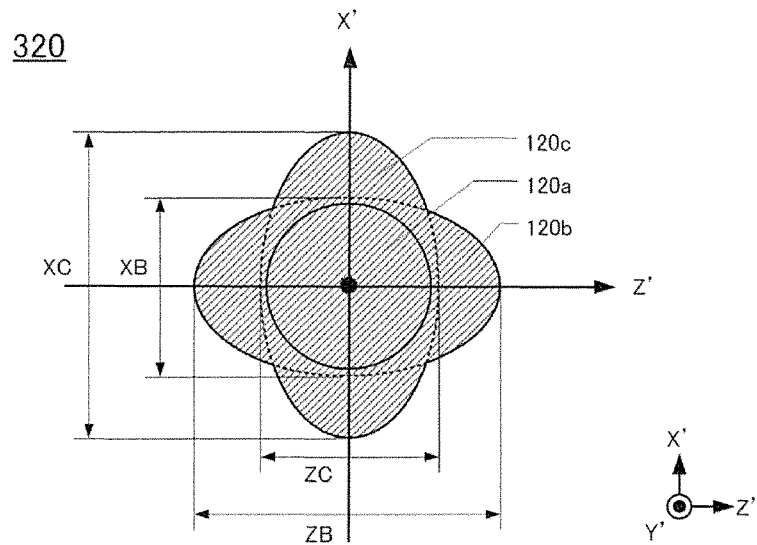
FIG. 6A is a plan view of an excitation electrode 320.

FIG. 6A is a plan view of an excitation electrode 320. The excitation electrode 320 is formed into a shape of overlapping the excitation electrode 120 illustrated in FIG. 4A with the excitation electrode 220 illustrated in FIG. 4B with the centers of the excitation electrode 120 and the excitation electrode 220 matched with one another. That is, the excitation electrode 320 includes the first region 120*a* and a second region. The second region is formed into a shape of overlapping the second region 120*b* and a second region 120*c* with centers of the second region 120*b* and the second region 120*c* matched. Assume that a length of the long axis of the second region 120*b* as ZB and a length of the short axis as XB, and a length of the long axis of the second region 120*c* as XC and a length of the short axis as ZC. Then, similar to the excitation electrode 120 illustrated in FIG. 2A, the excitation electrode 320 is formed such that the length ZB of the long axis of the second region 120*b* becomes in a range of 1.1 times to 2.0 times of the length XB of the short axis while the length XC of the long axis of the second region 120*c* becomes in a range of 1.1 times to 2.0 times of the length ZC of the short axis. The lengths of the short axes and the long axes of the second region 120*b* and the second region 120*c* may be identical to or different from one another.

With the excitation electrode having the long axis parallel to the Z'-axis like the excitation electrode 120, the flexure vibration, which is the unwanted response, transmitted in the Z'-axis direction can be reduced. With the excitation electrode having the long axis parallel to the X'-axis like the excitation electrode 220, the reflected wave in the main vibration and the flexure vibration and the end surface reflection, which are the unwanted responses, can be reduced. Since the excitation electrode 320 is formed into the shape of combining the elliptical shape whose long axis extends in the Z'-axis direction and the elliptical shape whose long axis extends in the X'-axis direction, the excitation electrode 320 has the features of both of the excitation electrode 120 and the excitation electrode 220.

Figure 6B:
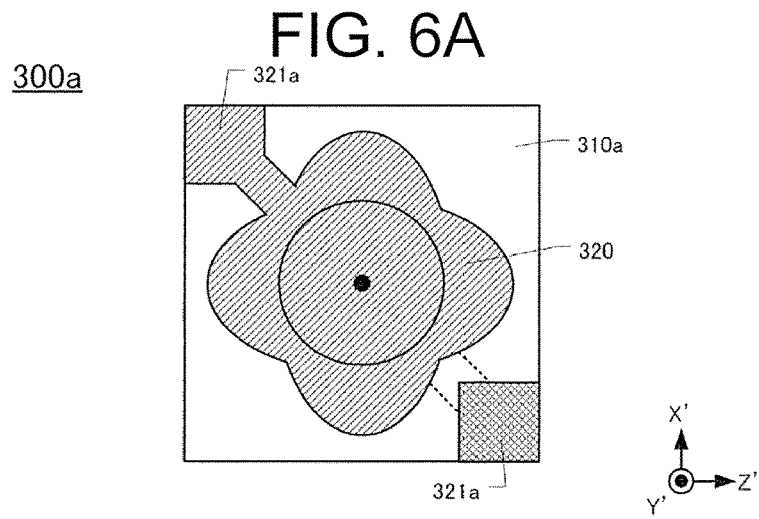
FIG. 6B is a plan view of a crystal resonator 300a, and FIG. 6C is a plan view of a crystal resonator 300b.

FIG. 6B is a plan view of a crystal resonator 300*a*. The crystal resonator 300*a* includes a crystal element 310*a*, the excitation electrodes 320, and extraction electrodes 321*a*. The excitation electrodes 320 are formed on both principal surfaces of the crystal element 310*a*. The extraction electrodes 321*a* are each extracted from the excitation electrodes 320. FIG. 6B shows an example where the length ZB and the length XC have the identical length, the crystal element 310*a* has a square planar surface, and sides of the crystal element 310*a* are each formed to be parallel to the Z'-axis or the X'-axis. The extraction electrodes 321*a* are each extracted from the excitation electrodes 320 to a corner on the +X'-axis side and the −Z'-axis side of the crystal element 310*a* and a corner on the −X'-axis side and the +Z'-axis side on the diagonal line of the crystal element 310*a*.

Figure 6C:
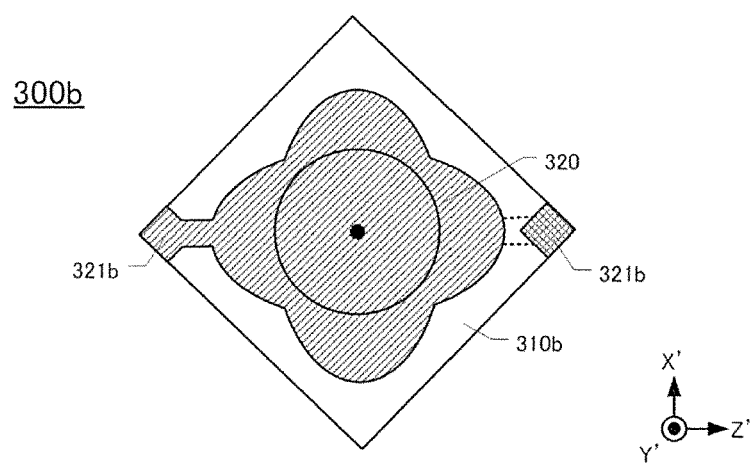

FIG. 6C is a plan view of the crystal resonator 300*b*. The crystal resonator 300*b* includes a crystal element 310*b*, the excitation electrodes 320, and extraction electrodes 321*b*. The excitation electrodes 320 are formed on both principal surfaces of the crystal element 310*b*. The extraction electrodes 321*b* are each extracted from the excitation electrodes 320. In FIG. 6C, the length ZB and the length XC have the identical length, the crystal element 310*b* has the square planar surface, and diagonal lines of the crystal element 310*b* are formed to be parallel to the Z'-axis and the X'-axis. The extraction electrodes 321*b* are each extracted from the excitation electrodes 320 to a corner on the +Z'-axis side and a corner on the −Z'-axis side of the crystal element 310*b*.

The crystal resonator 300*b* has the diagonal line of the crystal element 310*b* formed parallel to the Z'-axis or the X'-axis. This allows forming the wide area of the excitation electrode and therefore is preferable. FIG. 6B shows the example where the one side of the crystal element is parallel to the Z'-axis or the X'-axis. FIG. 6C shows the example where the one diagonal line of the crystal element is parallel to the Z'-axis or the X'-axis. Note that, considering the influence given to the support or a similar influence, the one side and the one diagonal line of the crystal element meet a preferable positional relationship where the one side or the one diagonal line is neither parallel to the Z'-axis nor the X'-axis and is positioned in a range of ±10 degrees with respect to the Z'-axis and the X'-axis, that is, the corner portions of the crystal element are positioned on a line displaced from the Z'-axis and the X'-axis by predetermined degrees in some cases.

<Configuration of Crystal Resonator 400>

Figure 7A:
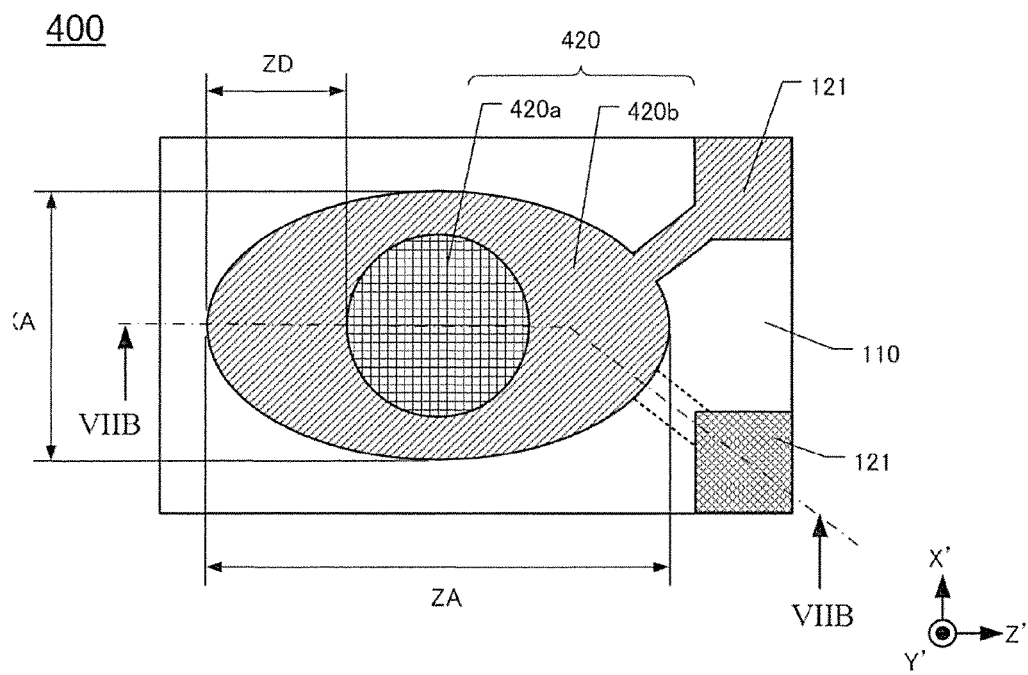
FIG. 7A is a plan view of a crystal resonator 400.

FIG. 7A is a plan view of the crystal resonator 400. The crystal resonator 400 includes the crystal element 110, excitation electrodes 420, and the extraction electrodes 121. The excitation electrode 420 includes a first region 420*a* with a circular outer shape and a second region 420*b*. The second region 420*b* is formed at a peripheral area of the first region 420*a*. The second region 420*b* has a thickness thinner than the first region 420*a* and has an elliptical outer shape. The second region 420*b* is formed such that a long axis extends in the Z'-axis direction and a short axis extends in the X'-axis direction similar to the second region 120*b* (see FIG. 2A). FIG. 7A denotes a length of the long axis of the second region 420*b* as ZA, a length of the short axis of the second region 420*b* as XA, and a difference between a long radius of the second region 420*b* and a radius of the first region 420*a* as ZD. The length ZA of the long axis is formed to be in a range of 1.1 times to 2.0 times of the length XA of the short axis.

Figure 7B:
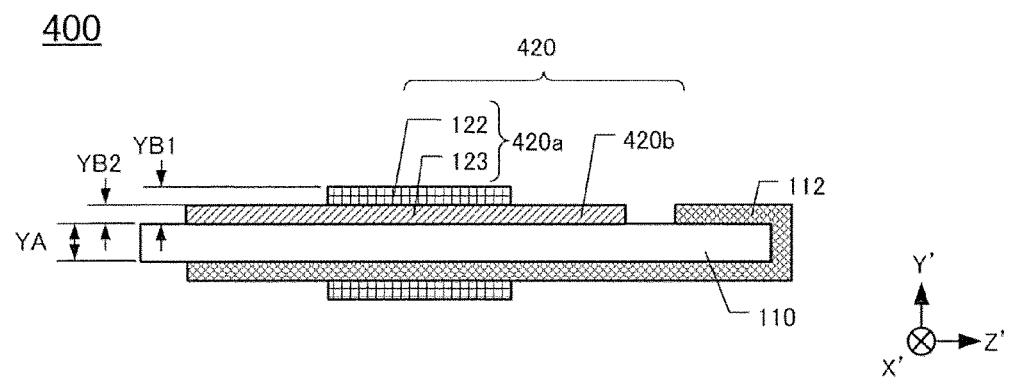
FIG. 7B is a cross-sectional view taken along a line VIIB-VIIB in FIG. 7A.

FIG. 7B is a cross-sectional view taken along a line VIIB-VIIB in FIG. 7A. Similar to the crystal resonator 100, in the crystal resonator 400, the thickness of the crystal element 110 is denoted as YA, a thickness of the first region 420*a* in the excitation electrode 420 as YB1, and a thickness of the second region 420b in the excitation electrode 420 as YB2. While the excitation electrodes 420 are the double electrodes formed by overlapping two electrode layers, the first layer 122 and the second layer 123, the first layer 122 is formed on the second layer 123 in the first region 420a unlike the excitation electrode 120 (see FIG. 2B).

In the crystal resonator with the excitation electrodes formed as the double electrodes, even if the order of formations of the first layer 122 and the second layer 123 in the first region 420a are changed and formed like the crystal resonator 400, unless the outer shape of the excitation electrode is changed, the crystal resonator 400 can reduce the CI value and reduce the variation of CI value similar to the crystal resonator 100.

Third Embodiment

The formation of an inclined portion whose surface is inclined at a peripheral area of an excitation electrode can also reduce the flexure vibration and the reflected wave. The following describes a crystal resonator with the inclined portion.

<Configuration of Crystal Resonator 500>

Figure 8A:
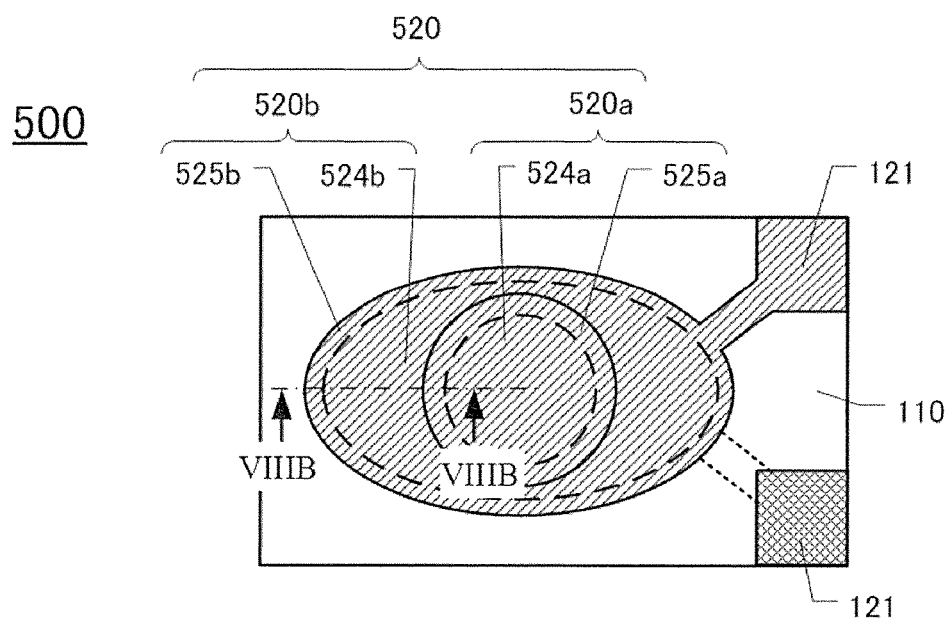
FIG. 8A is a plan view of a crystal resonator 500.

FIG. 8A is a plan view of the crystal resonator 500. The crystal resonator 500 includes the crystal element 110, excitation electrodes 520, and the extraction electrodes 121. Although the excitation electrode 520 is formed into the elliptical shape, which is identical to the excitation electrode 120 illustrated in FIG. 2A, the excitation electrode 520 differs from the excitation electrode 120 in that outer peripheries of a first region 520a and a second region 520b are inclined.

The first region 520a in the excitation electrode 520 includes a flat portion 524a with constant thickness and an inclined portion 525a. The inclined portion 525a is formed at a peripheral area of the flat portion 524a and whose thickness decreases in thickness from the inner peripheral side to the outer peripheral side. The second region 520b in the excitation electrode 520 includes a flat portion 524b with constant thickness and an inclined portion 525b. The inclined portion 525b is formed at a peripheral area of the flat portion 524b and whose thickness decreases in thickness from the inner peripheral side to the outer peripheral side. FIG. 8A indicates the insides of the dotted lines in the excitation electrode 520 as the flat portion 524a and the flat portion 524b while the outsides of the dotted lines as the inclined portion 525a and the inclined portion 525b.

Figure 8B:
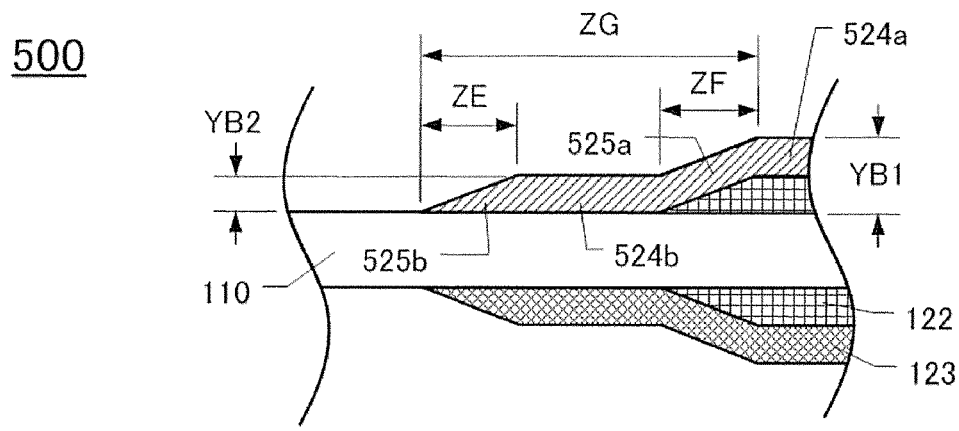
FIG. 8B is a cross-sectional view taken along a line VIIIB-VIIIB in FIG. 8A.

FIG. 8B is a cross-sectional view taken along a line VIIIB-VIIIB in FIG. 8A. The thickness of the flat portion 524a on the excitation electrode 520 is formed to be YB1. The thickness of the inclined portion 525a in the first region 520a is thinned with a length from the inner peripheral side to the outer peripheral side (inclination length) in a range of a length ZF. The thickness of the flat portion 524b in the second region 520b is formed to be YB2. The thickness of the inclined portion 525b is thinned with a length from the inner peripheral side to the outer peripheral side (inclination length) in a range of a length ZE. With the inclination length ZF of the inclined portion 525a and the inclination length ZE of the inclined portion 525b larger than ½ of the wavelength of unnecessary vibrations, the unnecessary vibrations can be reduced in the excitation electrode 520 and thereby the CI value can reduced. The entire inclined portion 525a, flat portion 524b, and inclined portion 525b can be considered as the inclined portion of the excitation electrode 520. Therefore, assuming that a longitudinal direction length of the electrode of the inclined portion 525a, the flat portion 524b, and the inclined portion 525b as ZG, the unnecessary vibrations can be reduced and thereby the CI value can reduced with the length ZG being natural number times of the wavelength in unnecessary vibrations.

Figure 8C:
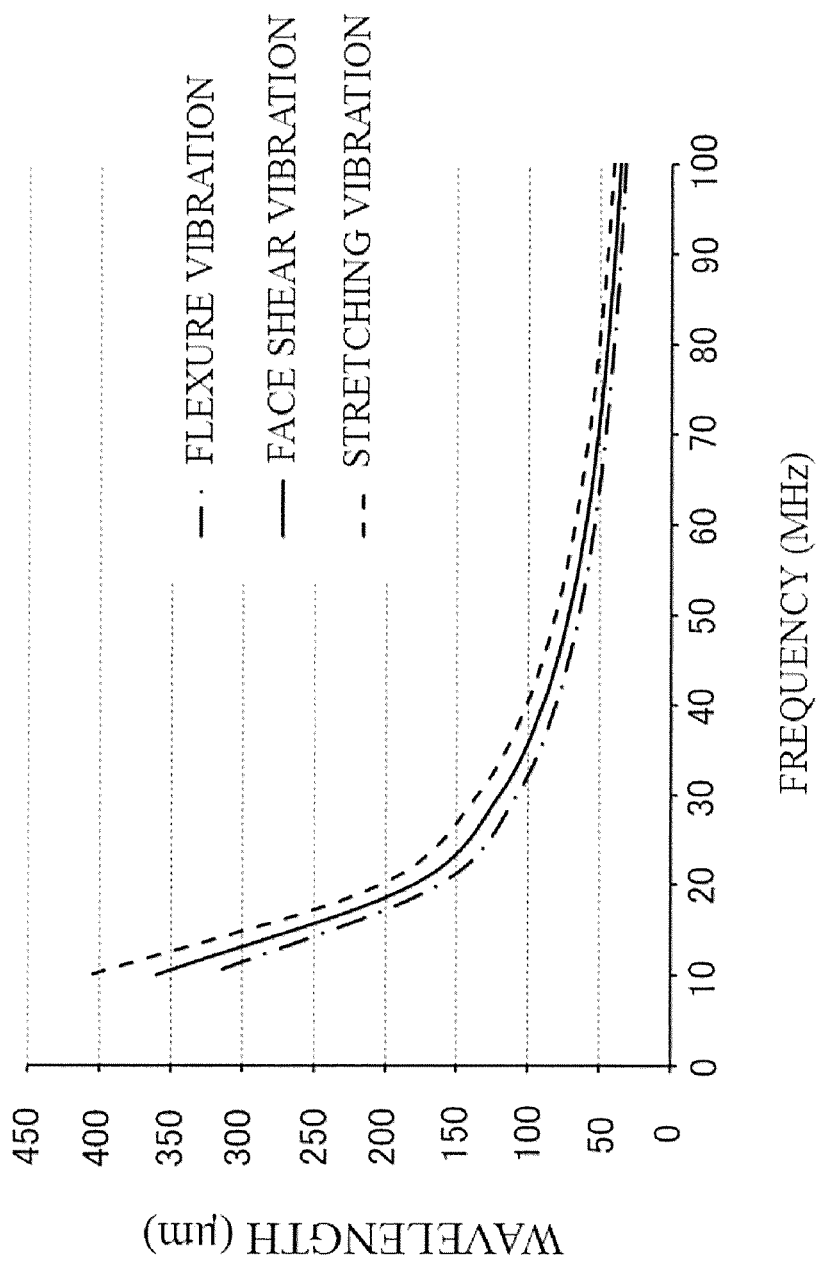
FIG. 8C is a graph showing a relationship between a wavelength of an unnecessary vibration and a frequency.

FIG. 8C is a graph showing the relationship between the wavelength in the unnecessary vibration and the frequency. FIG. 8C shows the frequency (MHz) of the crystal resonator on the horizontal axis and shows the wavelength (μm) of the unnecessary vibration on the vertical axis. The unnecessary vibration occurred in association with the main vibration includes various vibrations such as the flexure vibration, a face shear vibration, and a stretching vibration. FIG. 8C shows the flexure vibration by dashed-dotted line, shows the face shear vibration by the solid line, and shows the stretching vibration by the dotted line.

Since the flexure vibration affects the CI value of the doubly rotated crystal resonator most among the unnecessary vibrations, reducing the flexure vibration becomes important to reduce the CI value. For example, the flexure vibration has the wavelength at 108 μm with the oscillation frequency of the crystal resonator of 30 MHz. Therefore, configuring the length ZE and the length ZF to be 54 μm or more, which is the half of the wavelength of the flexure vibration, can substantially reduce the flexure vibrations. Since the wavelengths of the other unnecessary vibrations such as the face shear vibration and the stretching vibration close to the wavelength of the flexure vibration, the inclined portion for the flexure vibration can also reduce the other unnecessary vibrations.

<Inclination Length>

Figure 9A:
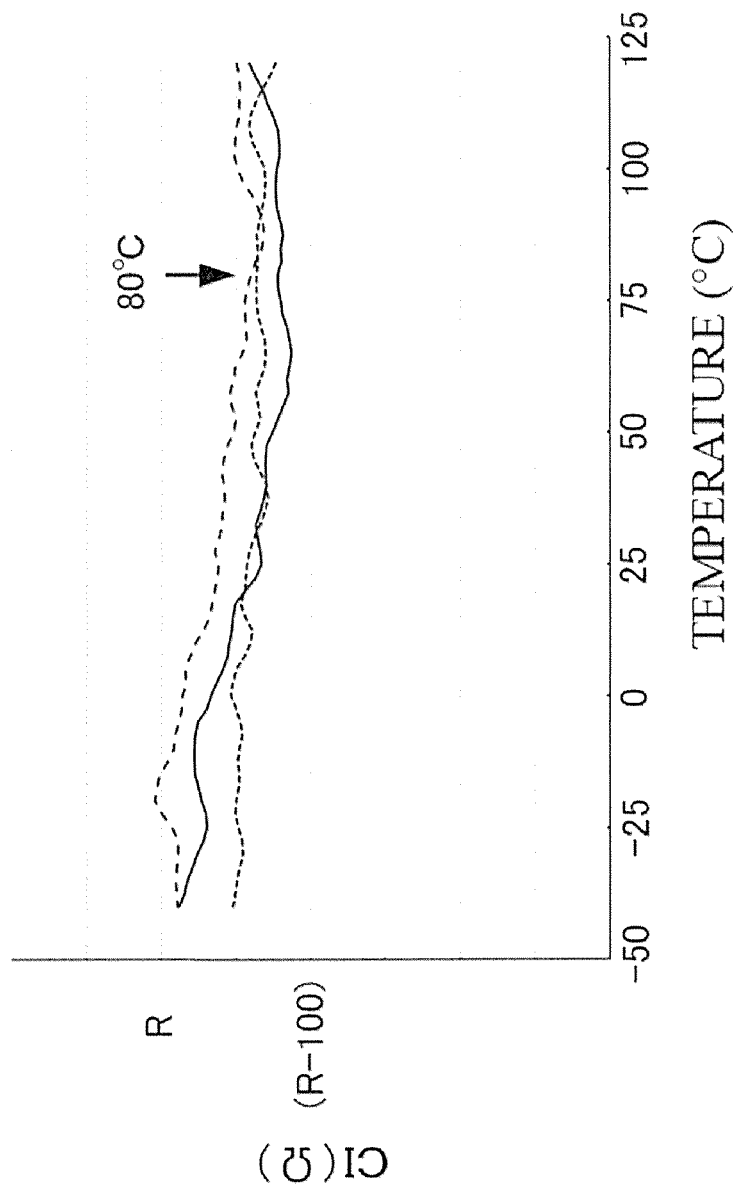
FIG. 9A is a graph showing a change in CI value according to a temperature with an inclination length of 50 µm.
Figure 9B:
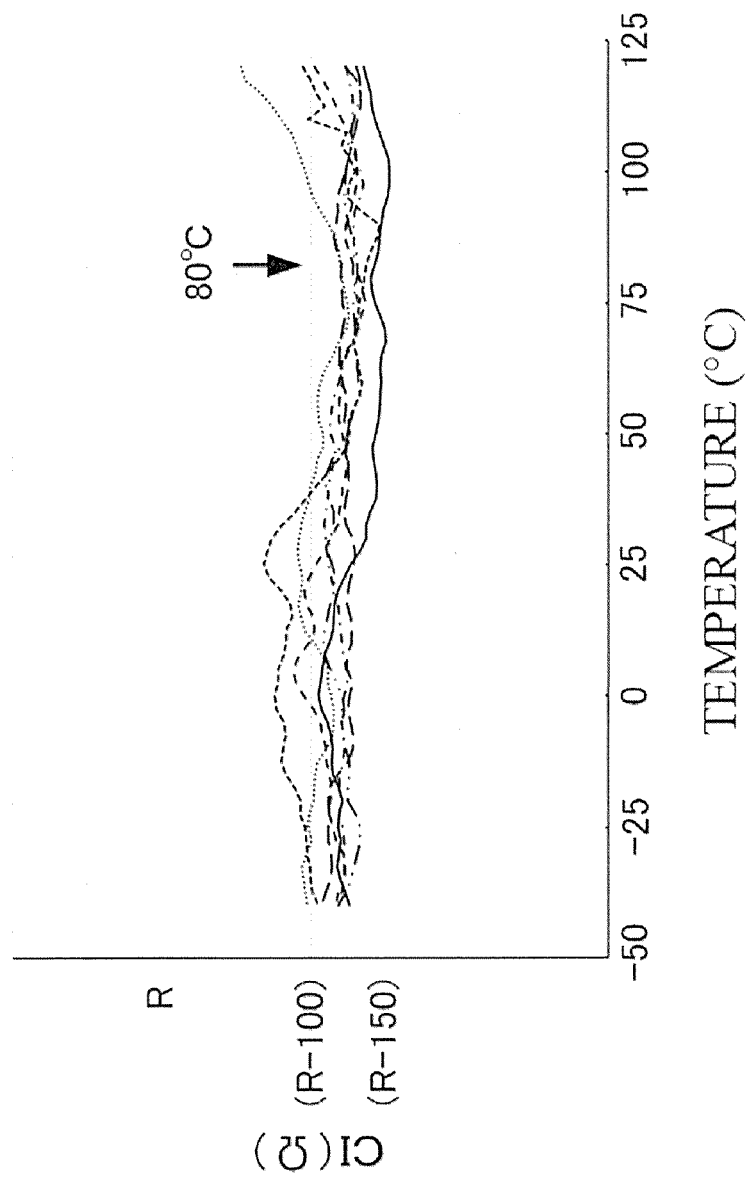
FIG. 9B is a graph showing the change in CI value according to the temperature with the inclination length of 55 µm.
Figure 9C:
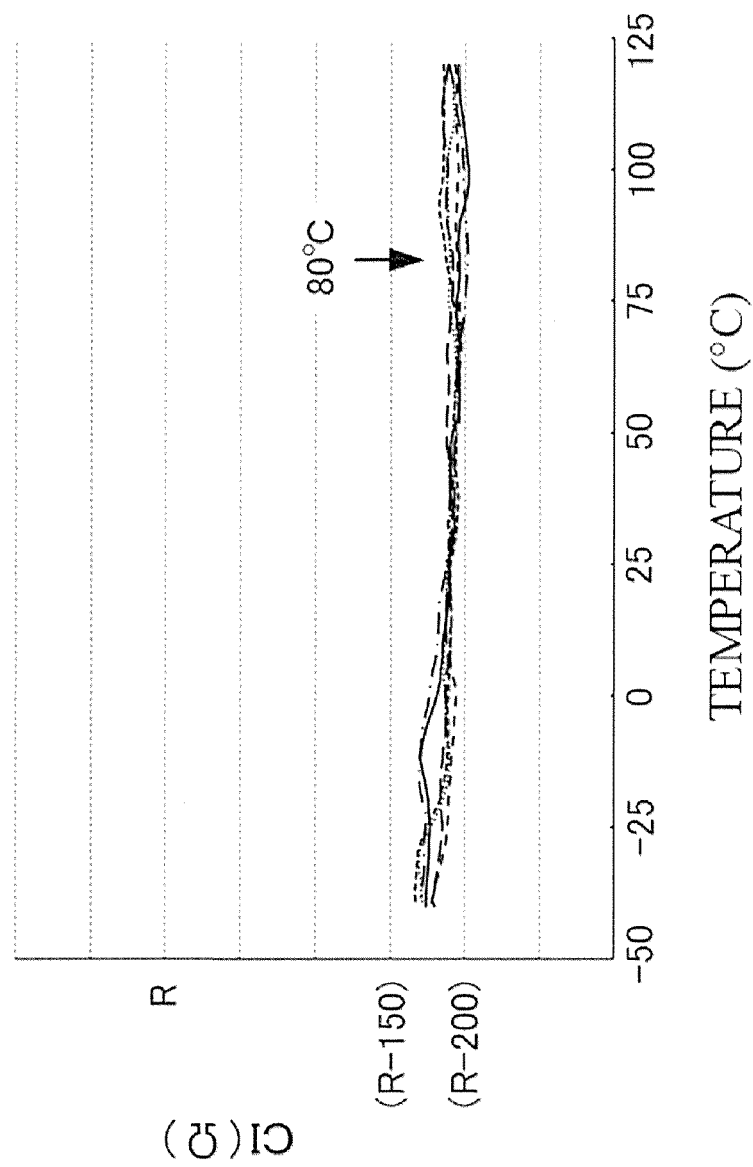
FIG. 9C is a graph showing the change in CI value according to the temperature with the inclination length of 400 µm.

FIG. 9A to FIG. 9C show results of measuring and obtaining the relationship between the CI value and the temperature with the inclination length changed in the case where the single-layer excitation electrode with a thickness of 1400' Å and a diameter of 0.6 A mm was formed on a crystal element with an A-mm square and was oscillated at 30 MHz. The following describes effects brought by the formation of the inclined portion in the excitation electrode with a comparison between the crystal resonators in FIG. 3A without the inclined portion and the crystal resonators in FIG. 9A to FIG. 9C.

FIG. 9A is a graph showing the change in CI value according to the temperature with the inclination length of 50 μm. FIG. 9A shows the change in CI value of the three crystal resonators according to the temperature and provides a scale at intervals of 50Ω on the vertical axis. The inclination length of the excitation electrodes of the respective crystal resonators is 50 μm. The CI values in FIG. 9A fall within a range of approximately from (R−100) Ω to R Ω. Especially, at 80° C., the temperature at which the doubly rotated crystal resonator is possibly used, the lowest CI value is (R−77.94) Ω and the highest CI value is (R−58.89) Ω. That is, the crystal resonators in FIG. 9A cause the variation of 18.05Ω at 80° C. These results show that, compared with the crystal resonators shown in FIG. 3A, the formation of the inclined portion substantially reduces and stabilizes the CI value.

FIG. 9B is a graph showing the change in CI value according to the temperature with the inclination length of 55 μm. FIG. 9B shows the change in CI value of the seven crystal resonators according to the temperature and provides a scale at intervals of 50Ω on the vertical axis. The inclination length of the excitation electrodes of the respective crystal resonators shown in FIG. 9B is 55 μm. That is, the inclination length of the excitation electrodes differs from the inclination length of the excitation electrodes in FIG. 9A. The CI values in FIG. 9B fall within a range of approximately from (R−150) Ω to (R−100) Ω. Especially, at 80° C., the temperature at which the doubly rotated crystal resonator is possibly used, the lowest CI value is (R−140.11) Ω and the highest CI value is (R−120.23) Ω. That is, the crystal resonators in FIG. 9B cause the variation of 19.88Ω at 80° C.

The crystal resonators in FIG. 9B show that the formation of the inclined portion substantially reduces and stabilizes the CI value compared with the crystal resonators in FIG. 3A, similar to the crystal resonators in FIG. 9A. It is seen that the crystal resonators in FIG. 9B entirely reduce the CI value by around 50Ω compared with the crystal resonators in FIG. 9A. It is thought that this result is caused by the inclination length of the crystal resonators in FIG. 9B being longer than that of the crystal resonators in FIG. 9A. Furthermore, the reason that only the 5 μm difference of the inclination length reduces the CI value to almost 50Ω is considered as follows. Since the inclination length in FIG. 9A is shorter than 54 μm, which is ½ of the wavelength of the flexure vibration, at 30 MHz, the flexure vibration is not sufficiently reduced. Meanwhile, the inclination length in FIG. 9B is longer than the 54 μm, which is ½ of he wavelength of the flexure vibration; therefore, the flexure vibration can be reduced to some extent.

FIG. 9C is a graph showing the change in CI value according to the temperature with the inclination length of 400 μm. FIG. 9C shows the change in CI value of the six crystal resonators according to the temperature and provides a scale at intervals of 50Ω on the vertical axis. The inclination length of the excitation electrodes of the respective crystal resonators shown in FIG. 9C is 400 μm. The CI values in FIG. 9C fall within a range of approximately from (R−200) Ω to (R−150) Ω. Especially, at 80° C., the temperature at which the doubly rotated crystal resonator is possibly used, the lowest CI value is (R−201.3) Ω and the highest CI value is (R−189.4) Ω. That is, the crystal resonators in FIG. 9C cause the variation of 11.9Ω at 80° C.

Compared with the crystal resonators in FIG. 3A, FIG. 9A, and FIG. 9B, the crystal resonators in FIG. 9C have the low CI values and the small variations of CI value. It is thought that these results are caused by the formation of the long inclination length. It is thought that, since the crystal resonators in FIG. 9C have the inclination length longer than 54 μm, which is ½ of the wavelength of the flexure vibration, at 30 MHz, the flexure vibration is sufficiently reduced.

The crystal resonators as shown in FIG. 9C can be formed by, for example, a method of using a metallic mask formed from a metal plate by a photolithography technology and a wet etching technique. Specifically, the mask is an overhang-shaped mask obtained using a property of promoting side etching together with etching in a thickness direction of the metal plate. Alternatively, a large number of thin masks whose opening dimensions become smaller little by little are laminated, and a spot welding is performed on these masks, thus forming one mask. The use of these overhang-shaped mask or large number of laminated thin masks allows forming the crystal resonators in FIG. 9C. The double electrodes with the inclined portion as illustrated in FIG. 8B can also be formed by the similar method.

A crystal resonator of a second aspect includes a flat plate-shaped crystal element and excitation electrodes. The flat plate-shaped crystal element has principal surfaces parallel to an X'-axis and a Z'-axis. The X'-axis is an axis of rotating an X-axis as a crystallographic axis of a crystal in a range of 15 degrees to 25 degrees around a Z-axis as a crystallographic axis of the crystal. The Z'-axis is an axis of rotating the Z-axis in a range of 33 degrees to 35 degrees around the X'-axis. The excitation electrodes are formed on the respective principal surfaces of the crystal element. The excitation electrodes include a first region with a circular outer shape and a second region. The second region is formed at a peripheral area of the first region. The second region has a thickness thinner than the first region and has an elliptical outer shape. The elliptical shape has a long axis extending in a direction in a range of ±5 degrees with respect to a direction that the Z'-axis extends.

The crystal resonators of third aspects according to the first aspect and the second aspect are configured as follows. The crystal element is formed into a square or a rectangle where one diagonal line is in a range of ±10° with respect to the Z'-axis. Alternatively, the crystal element is formed into a square or a rectangle where one side is in a range of ±10° with respect to the Z'-axis (Note that the square and the rectangle include an approximately square and an approximately rectangle where a corner portion of the crystal element has a rounded shape or a similar shape). The reason of describing the range as ±10° here is that the excitation electrodes according to this disclosure are disposed at the specific positions within this range and further an influence given to the support of the crystal element can be reduced and the crystal element easy to be processed is selectable.

The crystal resonators of fourth aspects according to the first aspect to the third aspect are configured as follows. A ratio of the long axis to a short axis of the elliptical shape is in a range of 1.1:1 to 2.0:1.

The crystal resonators of fifth aspects according to the first aspect to the third aspect are configured as follows. The crystal element vibrates at a predetermined frequency. A center of the elliptical shape matches a center of the circular shape. A difference between a long radius of the elliptical shape and a radius of the circular shape is natural number times of a wavelength of an unnecessary vibration occurred together with the vibration.

A crystal resonator of a sixth aspect includes a flat plate-shaped crystal element and excitation electrodes. The crystal element has principal surfaces parallel to an X'-axis and a Z'-axis. The X'-axis is an axis of rotating an X-axis as a crystallographic axis of a crystal in a range of 15 degrees to 25 degrees around a Z-axis as a crystallographic axis of the crystal. The Z'-axis is an axis of rotating the Z-axis in a range of 33 degrees to 35 degrees around the X'-axis. The excitation electrodes are formed on the respective principal surfaces of the crystal element. The excitation electrodes each include a first region with a circular outer shape and a second region. The second region is formed at a peripheral area of the first region. The second region has a thickness thinner than the first region. An outer shape of the second region is formed into a shape of combining a first elliptical shape and a second elliptical shape. The first elliptical shape has a long axis extending in a direction in a range of −5 degrees to +15 degrees with respect to a direction that the X'-axis extends. The second elliptical shape has a long axis extending in a direction in a range of ±5 degrees with respect to a direction that the Z'-axis extends.

The crystal resonator of a seventh aspect according to the sixth aspect is configured as follows. The first elliptical shape has a ratio of the long axis to a short axis in a range of 1.1:1 to 2.0:1. The second elliptical shape has a ratio of the long axis to a short axis in a range of 1.1:1 to 2.0:1.

The crystal resonators of eighth aspects according to the sixth aspect and the seventh aspect are configured as follows. The crystal element vibrates at a predetermined frequency. A center of the first elliptical shape, a center of the second elliptical shape, and a center of the circular shape match. A difference between a long radius of the first elliptical shape and a radius of the circular shape, and a difference between a long radius of the second elliptical shape and the radius of the circular shape are respective natural number times of a wavelength of an unnecessary vibration occurred together with the vibration.

The crystal resonators of ninth aspects according to the first aspect to the eighth aspect are configured as follows. The excitation electrodes have a thickness in a range of 0.02% to 0.13% of a thickness of the crystal element.

The crystal resonators of tenth aspects according to the first aspect to the ninth aspect are configured as follows. The first region and the second region are formed to have a difference in thickness in a range of ¼ times to one time with respect to a thickness of the second region.

With the crystal resonator according to the embodiments, a coupling of an unwanted response to a main vibration is reduced, thereby ensuring reducing a CI value low.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A crystal resonator, comprising:
   a crystal element with a flat plate shape that has principal surfaces parallel to an X'-axis and a Z'-axis, the X'-axis being an axis of rotating an X-axis as a crystallographic axis of a crystal in a range of 15 degrees to 25 degrees around a Z-axis as a crystallographic axis of the crystal, the Z'-axis being an axis of rotating the Z-axis in a range of 33 degrees to 35 degrees around the X'-axis; and
   excitation electrodes, formed on the respective principal surfaces of the crystal element, wherein
   the excitation electrodes include a first region with a circular outer shape and a second region, the second region being formed at a peripheral area of the first region, the second region having a thickness thinner than the first region and having an elliptical outer shape,
   the elliptical shape having a long axis extending in a direction in a range of −5 degrees to +15 degrees with respect to a direction that the X'-axis extends.

2. The crystal resonator according to claim 1, wherein the crystal element is formed into a square or a rectangle where one diagonal line is in a range of ±10° with respect to the Z'-axis, alternatively, the crystal element being formed into a square or a rectangle where one side is in a range of ±10° with respect to the Z'-axis.

3. The crystal resonator according to claim 1, wherein a ratio of the long axis to a short axis of the elliptical shape is in a range of 1.1:1 to 2.0:1.

4. The crystal resonator according to claim 1, wherein the crystal element vibrates at a predetermined frequency, a center of the elliptical shape matches a center of the circular shape, and
   a difference between a long radius of the elliptical shape and a radius of the circular shape is natural number times of a wavelength of an unnecessary vibration occurred together with the vibration.

5. The crystal resonator according to claim 1, wherein the excitation electrodes have a thickness in a range of 0.02% to 0.13% of a thickness of the crystal element.

6. The crystal resonator according to claim 1, wherein the first region and the second region are formed to have a difference in thickness in a range of ¼ times to one time with respect to a thickness of the second region.

7. A crystal resonator, comprising:
   a crystal element with a flat plate shape that has principal surfaces parallel to an X'-axis and a Z'-axis, the X'-axis being an axis of rotating an X-axis as a crystallographic axis of a crystal in a range of 15 degrees to 25 degrees around a Z-axis as a crystallographic axis of the crystal, the Z'-axis being an axis of rotating the Z-axis in a range of 33 degrees to 35 degrees around the X'-axis; and
   excitation electrodes, formed on the respective principal surfaces of the crystal element, wherein
   the excitation electrodes include a first region with a circular outer shape and a second region, the second region being formed at a peripheral area of the first region, the second region having a thickness thinner than the first region and having an elliptical outer shape,
   the elliptical shape having a long axis extending in a direction in a range of ±5 degrees with respect to a direction that the Z'-axis extends.

8. The crystal resonator according to claim 7, wherein the crystal element is formed into a square or a rectangle where one diagonal line is in a range of ±10° with respect to the Z'-axis, alternatively, the crystal element being formed into a square or a rectangle where one side is in a range of ±10° with respect to the Z'-axis.

9. The crystal resonator according to claim 7, wherein a ratio of the long axis to a short axis of the elliptical shape is in a range of 1.1:1 to 2.0:1.

10. The crystal resonator according to claim 7, wherein the crystal element vibrates at a predetermined frequency, a center of the elliptical shape matches a center of the circular shape, and
    a difference between a long radius of the elliptical shape and a radius of the circular shape is natural number times of a wavelength of an unnecessary vibration occurred together with the vibration.

11. The crystal resonator according to claim 7, wherein the excitation electrodes have a thickness in a range of 0.02% to 0.13% of a thickness of the crystal element.

12. The crystal resonator according to claim 7, wherein the first region and the second region are formed to have a difference in thickness in a range of ¼ times to one time with respect to a thickness of the second region.

13. A crystal resonator, comprising:
    a crystal element with a flat plate shape that has principal surfaces parallel to an X'-axis and a Z'-axis, the X'-axis being an axis of rotating an X-axis as a crystallographic axis of a crystal in a range of 15 degrees to 25 degrees around a Z-axis as a crystallographic axis of the crystal, the Z'-axis being an axis of rotating the Z-axis in a range of 33 degrees to 35 degrees around the X'-axis; and
    excitation electrodes, formed on the respective principal surfaces of the crystal element, wherein:

the excitation electrodes each include a first region with a circular outer shape and a second region, the second region being formed at a peripheral area of the first region, the second region having a thickness thinner than the first region, and
an outer shape of the second region is formed into a shape of combining a first elliptical shape and a second elliptical shape, the first elliptical shape having a long axis extending in a direction in a range of −5 degrees to +15 degrees with respect to a direction that the X'-axis extends, the second elliptical shape having a long axis extending in a direction in a range of ±5 degrees with respect to a direction that the Z'-axis extends.

14. The crystal resonator according to claim 13, wherein the first elliptical shape has a ratio of the long axis to a short axis in a range of 1.1:1 to 2.0:1,
the second elliptical shape having a ratio of the long axis to a short axis in a range of 1.1:1 to 2.0:1.

15. The crystal resonator according to claim 13, wherein the crystal element vibrates at a predetermined frequency,
a center of the first elliptical shape, a center of the second elliptical shape, and a center of the circular shape match, and
a difference between a long radius of the first elliptical shape and a radius of the circular shape, and a difference between a long radius of the second elliptical shape and the radius of the circular shape are respective natural number times of a wavelength of an unnecessary vibration occurred together with the vibration.

16. The crystal resonator according to claim 13, wherein the excitation electrodes have a thickness in a range of 0.02% to 0.13% of a thickness of the crystal element.

17. The crystal resonator according to claim 13, wherein the first region and the second region are formed to have a difference in thickness in a range of ¼ times to one time respect to a thickness of the second region.

* * * * *